United States Patent
Hoeger

(10) Patent No.: US 11,305,368 B2
(45) Date of Patent: Apr. 19, 2022

(54) INDUCTIVE POSITION SENSOR WITH SWITCH FUNCTION

(71) Applicant: Illinois Tool Works Inc., Glenview, IL (US)

(72) Inventor: Michael V. Hoeger, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 135 days.

(21) Appl. No.: 16/777,185

(22) Filed: Jan. 30, 2020

(65) Prior Publication Data

US 2021/0237187 A1 Aug. 5, 2021

(51) Int. Cl.
| B23K 9/095 | (2006.01) |
| B23K 9/16 | (2006.01) |
| B23K 37/04 | (2006.01) |
| H05K 1/14 | (2006.01) |
| H05K 1/16 | (2006.01) |

(52) U.S. Cl.
CPC ............ B23K 9/0956 (2013.01); B23K 9/164 (2013.01); B23K 37/04 (2013.01); H05K 1/147 (2013.01); H05K 1/165 (2013.01); H05K 2201/10151 (2013.01)

(58) Field of Classification Search
CPC ...... B23K 9/0956; B23K 9/164; B23K 37/04; H05K 1/147; H05K 1/165; H05K 2201/10151
USPC .......................................................... 219/74
See application file for complete search history.

(56) References Cited

U.S. PATENT DOCUMENTS

| 5,334,967 A | 8/1994 | Paszkiewicz |
| 5,793,016 A | 8/1998 | Colling |
| 6,420,680 B1 | 7/2002 | Samodell |
| 9,820,614 B1 | 11/2017 | Dingler |
| 2012/0006810 A1 | 1/2012 | Fan |
| 2015/0234075 A1 | 8/2015 | Moore |
| 2015/0369631 A1 | 12/2015 | Cheung |
| 2016/0303676 A1 | 10/2016 | Roybal |
| 2017/0341889 A1* | 11/2017 | Kikuta ................... B41J 13/103 |
| 2019/0037651 A1 | 1/2019 | Hoeger |

FOREIGN PATENT DOCUMENTS

| DE | 68908805 T2 | 12/1993 |
| DE | 102018102094 A1 | 8/2019 |
| EP | 2966627 A1 | 1/2016 |
| WO | 9739312 A1 | 10/1997 |

OTHER PUBLICATIONS

European Patent Office, Communication with extended European search report, Application No. 20190193.1, dated Dec. 18, 2020 (13 pages).

(Continued)

*Primary Examiner* — Binh B Tran
(74) *Attorney, Agent, or Firm* — McAndrews, Held & Malloy, Ltd.

(57) ABSTRACT

A sensor which includes inductive coils and an inductance to digital converter. The output of the sensor may be used to replace the functions of a switch and a potentiometer to initiate and control various outputs in welding-type systems and applications.

16 Claims, 6 Drawing Sheets

(56) References Cited

OTHER PUBLICATIONS

European Patent Office, Communication with extended European search report, Application No. 20190186.5, dated Mar. 4, 2021 (7 pages).
European Patent Office, Communication with extended European search report, Application No. 21153086.0 dated Jun. 21, 2021 (8 pages).
Texas Instruments, Application Report, SNOA931—Apr. 2015, LDC1612/LDC1614 Linear Position Sensing, 2015 (14 pages).
Texas Instruments, Application Report, LDC Target Design, SNOA957A—Sep. 2016—Revised May 2017, (13 pages).
Texas Instruments, Application Report, LDC Sensor Design, SNOA930A—Mar. 2015—Revised Apr. 2018, (27 pages).
Texas Instruments, LDC1612, LDC1614 Multi-Channel 28-Bit Inductance to Digital Converter (LDC) for Inductive Sensing, SNOSCY9A—Dec. 2014—Revised Mar. 2018 (65 pages).
Non-Final Office Action U.S. Appl. No. 16/543,008 dated Nov. 9, 2021.
Non-Final Office Action U.S. Appl. No. 16/543,023 dated Nov. 19, 2021.
European Office Communication Appln No. 20190186.5 dated Feb. 11, 2022.

\* cited by examiner

INDUCTIVE POSITION SENSOR WITH SWITCH FUNCTION

BACKGROUND

The present disclosure relates to sensors including inductive coils, and, more particularly, to welding systems and apparatus that incorporate such sensors for control purposes.

Some welding processes and some welding equipment include user controls where the control both acts as an on/off switch and controls the output level. For example, gas tungsten arc welding ("GTAW), also known as tungsten inert gas ("TIG") welding, processes may include a foot pedal and/or a finger-tip control that controls the output of a TIG welding torch. Various on/off and output controls may be used with various welding equipment and processes.

SUMMARY

The present disclosure relates to sensors including inductive coils, and, more particularly, to systems and apparatus including such sensors for welding control purposes, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numerals are used to refer to similar or identical elements.

DETAILED DESCRIPTION

Figure 1:
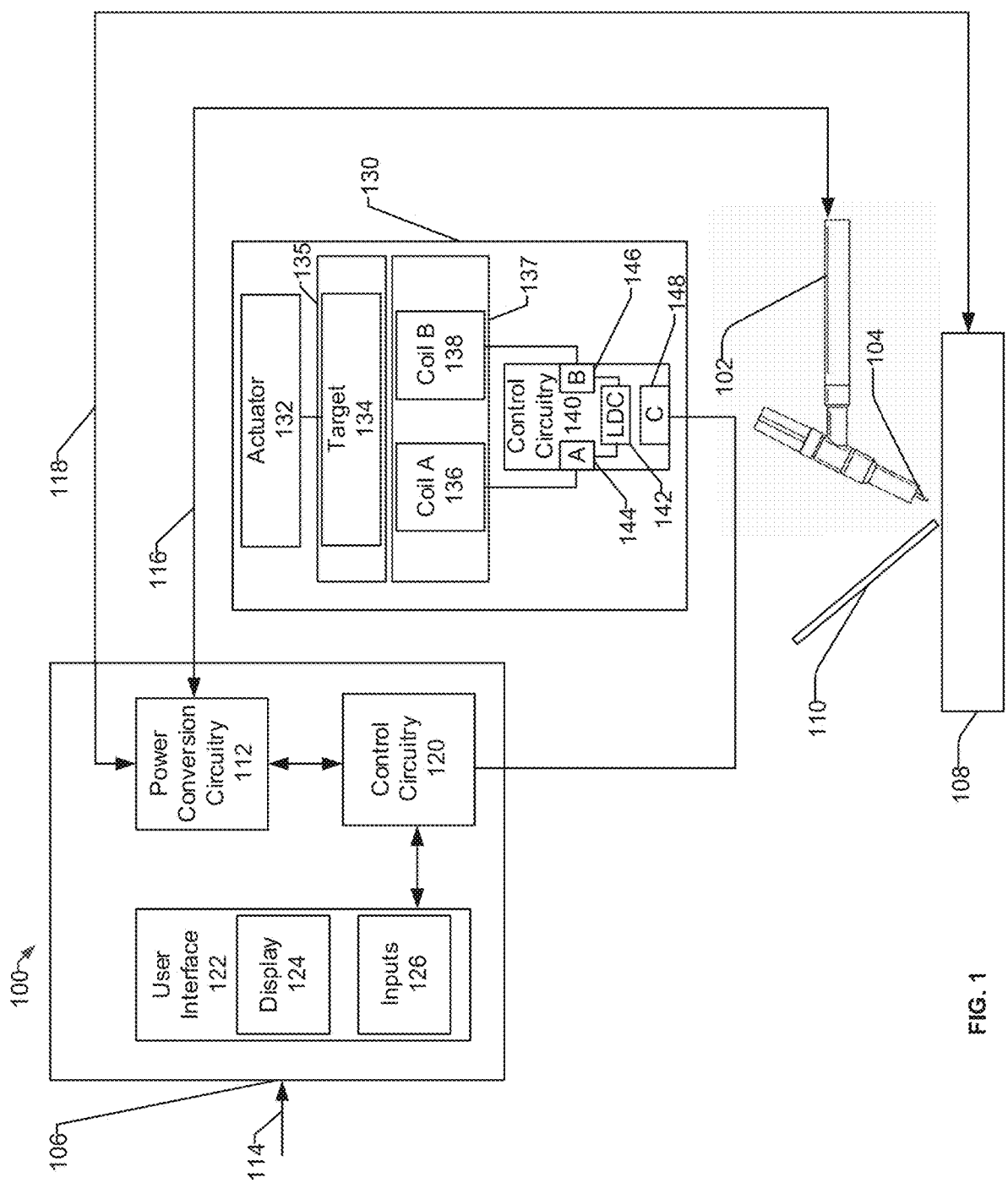
FIG. 1 is a diagram of an example welding system including a sensor including two inductive coils to determine an input value to control a device, in accordance with aspects of this disclosure.

In some welding applications, physically manipulable controllers are used which act as both an on/off switch for an output and control the level or magnitude of that output. For example, in TIG welding, a foot pedal may be used to both turn on and off power supplied to a TIG torch and control the magnitude of the power supplied to the torch. For example, an operator may turn power to the TIG torch on by pressing on the foot pedal to displace the foot pedal a threshold distance, which initiates output of power from a power source to the torch. Once the foot pedal is displaced past the threshold distance, the operator controls the magnitude of the power output to the torch by controlling the displacement of the pedal. When the operator releases the pedal back past the first threshold distance, the output from the power source is cut off to the torch. In some example TIG welding applications, a finger-tip control attached to the TIG torch may be used similarly to a foot pedal. An operator may slide a finger-tip control past a first threshold distance to initiate power from a power source to the torch. Once the finger-tip control is past the threshold distance, the operator controls the magnitude of the power output to the torch by controlling the displacement of the finger-tip control. When the operator releases the finger-tip control back past the first threshold distance, the output from the power source is cut off to the torch.

Conventionally, this type of switch and magnitude control is achieved via a combination of a potentiometer and a miniature snap-action switch. Pressing the pedal past a threshold distance causes the switch to close, and releasing the pedal back across the threshold distance causes the switch to open. When the switch closes, a signal is sent to the power source to output welding-type power to the torch. The level of power output to the torch is controlled by a potentiometer which is actuated by the movement of the foot pedal. Accordingly, once the foot pedal is displaced a threshold distance, further displacement adjusts a potentiometer which controls the power output to the torch.

In conventional switch/potentiometer control sensors, the switch should be activated in the low dead-band of the potentiometer. If the switch activates above the low dead-band of the potentiometer, then part of the useful portion of the potentiometer is wasted. Conversely, if the switch is never activated, the switch may never open and the output will continuously remain on. These problems may be exacerbated if the switch and the potentiometer do not use the same mechanical datum. In addition to the tolerance stack up of the switch and the potentiometer, there is also mechanical tolerance stack up of the locations of the pedal which provide input for the switch and the potentiometer. A gang potentiometer or a stack of a potentiometer and a switch on the same input shaft may resolve some of these issues, but these types of potentiometers are often expensive, suffer from low cycle life, are low ingress rated, and are typically useful for power, and not signal level switching.

Disclosed example welding systems and accessories include inductive sensors to provide switching and control at a substantially reduced cost and increased reliability compared to conventional devices using combinations of switches and potentiometers. In some examples, a coil with a spacing on one side of the coil that is different from a spacing on the other side of the coil produces an approximately linear flux density gradient. As used herein, the term spacing refers to the distance between successive corresponding portions of turns of the coil. As used herein, coil density refers to the number of turns of a coil within a given distance. This flux density gradient can be utilized to achieve the potentiometer/switch function (e.g., can be used to control on/off and the output magnitude). As a conductive target moves along the length of the coil in proximity to the coil, the resonant frequency of a resonant circuit that includes the coil changes.

In an approximately linear geometric application, two adjacent coils may be used to produce a phase plot in which the first coil output is plotted on the x-axis and the second coil output is plotted on the y-axis as the target moves along the lengths of the coils in proximity to the coils. The use of two coils allows for the recognition and management of common-mode error in the first coil and the second coil. For example, in a situation in which only one coil is used, if the target moves away from the coil in the z-axis (e.g., the axis perpendicular to the plane containing the coils), the sensor would appear to detect movement toward the lower flux density region of the coil. With two coils, however, error caused by movement of the target in the z-axis can be detected and mitigated. For example, if the two coils are arranged in opposite directions, the two coils will produce the same x-y plot shape even if the target moves in the z-axis, and control circuitry can recognize and eliminate error caused by the target moving away from the plane of the coils in the z-axis. In some examples, if the target is configured such that the position of the target has a greater affect with respect the response of one coil (e.g., because the target is physically closer to one of the two coils), then the control circuitry can also recognize and eliminate error caused by movement of the target in the z-axis as the error will have a greater effect on the output of the coil upon which the target has the greater effect. Disclosed example control circuitry recognizes the error by comparing the outputs of the two coils. Thus, the two coils reduce susceptibility to common-mode interference as compared to a single coil. To reduce common-mode error, in some examples the coil and target may be biased such that the target does not move in the z-axis with respect to the coil.

The coils have a densely spaced region and a sparsely spaced region. The sparse region refers to the region where the distance between corresponding portions of successive turns of the coil is greater than a threshold distance. The dense region refers to the region where the distance between corresponding portions of successive turns of the coil is less than a threshold distance. Because the spacing on one side of the coil is different from the spacing on the other side of the coil (e.g., the coils have a dense region and a sparse region), the outputs of the resonant circuits (e.g., the resonant frequency of the circuit) that include the coils are not monotonic as the position of the target moves from the sparse region to the dense region, or from the dense region to the sparse region.

As used herein, the terms monotonic response or monotonic output mean that for a continuous direction input (e.g., the input is either only increasing in value or only decreasing in value) the corresponding output or corresponding response is either always positive or always negative. If the target enters a coil from the densely wound region of the coil (the region where the spacing is smaller), the output of the circuit including the coil will increase rapidly and then decrease slowly after passing the point along the length of the coils where the dense region transitions to the sparse region (the point along the length of the coils where the spacing begins to increase). Conversely, if the target enters from the non-densely, or sparsely, wound region, then the output will slowly increase until reaching the point along the length of the coils where the sparse region transitions to the dense region. The specific response is dependent on the geometries of the coil(s) and the target(s). Although generally described as the target moving while the coils are stationary, in some examples the coils may move while the target is stationary and in some examples both the coils and the target may move. Relative movement between the target and the coils generates outputs from the coils as described above.

In some examples, the target may be configured to only travel within a zone such that the response of each coil is monotonic. For example, the target may be configured to only travel within the sparse regions of each coil (e.g., the target is restricted such that the target only travels within the sparse region of each coil). The target may be configured such that it is physically restricted from reaching the point on the coil where the sparse region transitions to the dense region. Therefore, as the target travels in one direction along the coils, the outputs are monotonic (e.g., consistently not decreasing or consistently not increasing). In some examples, a certain combination of outputs of the coils may correspond to a switch function, and the remaining travelable length of the coils can be used as the potentiometer function.

Although described as a foot pedal, the inductive sensors/controllers described can be used in any sensor/controller which requires a potentiometer/switch function. For example, the inductive sensors described may be used in hand controllers, finger-tip controllers, welding gun triggers, control knobs on welding power supplies, wire feeders or welding pedants, or in any other control on the welding torch.

Disclosed example sensors include: a first coil having a first region and a second region, the first region having a spacing between successive corresponding portions of turns of the first coil less than a first threshold distance, and the second region having a spacing between successive corresponding portions of turns of the first coil greater than the first threshold; a second coil having a third region and a fourth region, the third region having a spacing between successive corresponding portions of turns of the second coil less than a second threshold distance, and the fourth region having a spacing between successive corresponding portions of turns of the second coil greater than the second threshold; a conductive target configured to travel within a travel zone extending from a first location to a second location, where both the first location and the second location are adjacent to both the second region and the fourth region; and measurement circuitry configured to measure a first response of the first coil and a second response of the second coil to a position of the conductive target within the travel zone.

In some disclosed example sensors, the measurement circuitry is configured to detect when a combination of the first response and the second response satisfies a third threshold.

In some disclosed example sensors, the combination is a function of the first response and the second response.

In some disclosed example sensors, the measurement circuitry is configured to determine the position of the conductive target relative to the first coil and the second coil based on the combination of the first response and the second response after determining that the combination satisfied the third threshold.

In some disclosed example sensors, the measurement circuitry is configured to: output a first signal indicating whether the combination satisfies the third threshold; and output a second signal based on the magnitude of the combination if the combination satisfies the third threshold.

In some disclosed example sensors, the first response corresponds to a first inductance and the second response corresponds to a second inductance.

In some disclosed example sensors, the first coil is connected to a first resonant circuit and the second coil is connected to a second resonant circuit, and the first response includes a first resonant frequency of the first resonant circuit and the second response includes a second resonant frequency of the second resonant circuit.

In some disclosed example sensors, the first coil and the second coil are formed on a first circuit board, and the conductive target includes a conductive strip on a second circuit board.

In some disclosed example sensors, the first circuit board is a rigid printed circuit board and the second circuit board is a flexible circuit board.

In some disclosed example sensors, the second circuit board is biased to reduce a variation in distance between the first circuit board and the second circuit board as the target travels within the travel zone.

In some disclosed example sensors, the first coil and the second coil are located in a first plane, the conductive target is configured to travel in a second plane, and the second plane is parallel to the first plane.

In some disclosed example sensors, the first coil and the second coil are arranged such that the first response increases in magnitude and the second response decreases in magnitude as the target moves from the first location to the second location.

In some disclosed example sensors, the first coil and the second coil are arranged such that the first response decreases in magnitude and the second response decreases in magnitude as the target moves from the first location to the second location.

In some disclosed example sensors, the first coil and the second coil are arranged such that the first response increases in magnitude and the second response increases in magnitude as the target moves from the first location to the second location.

Disclosed example mechanically actuated controllers include: a first coil having a first region and a second region, the first region having a spacing between successive corresponding portions of turns of the first coil less than a first threshold distance, and the second region having a spacing between successive corresponding portions of turns of the first coil greater than the first threshold; a second coil having a third region and a fourth region, the third region having a spacing between successive corresponding portions of turns of the second coil less than a second threshold distance, and the fourth region having a spacing between successive corresponding portions of turns of the second coil greater than the second threshold; a mechanical travel device configured to actuate a conductive target, where the conductive target is configured to travel within a travel zone extending from a first location to a second location, where both the first location and the second location are adjacent to both the second region and the fourth region; and measurement circuitry configured to measure a first response of the first coil and a second response of the second coil to a position of the conductive target within the travel zone.

In some disclosed mechanically actuated controllers, the mechanical travel device is a foot pedal.

In some disclosed mechanically actuated controllers, the measurement circuitry is configured to: output a first signal indicating whether the combination satisfies the third threshold; and output a second signal based on the magnitude of the combination if the combination satisfies the third threshold.

Disclosed example welding control devices include: a first coil having a first region and a second region, the first region having a spacing between successive corresponding portions of turns of the first coil less than a first threshold distance, and the second region having a spacing between successive corresponding portions of turns of the first coil greater than the first threshold; a second coil having a third region and a fourth region, the third region having a spacing between successive corresponding portions of turns of the second coil less than a second threshold distance, and the fourth region having a spacing between successive corresponding portions of turns of the second coil greater than the second threshold; a conductive target configured to travel within a travel zone extending from a first location to a second location, where both the first location and the second location are adjacent to both the second region and the fourth region; measurement circuitry configured to measure a first response of the first coil and a second response of the second coil to a position of the conductive target within the travel zone; and communications circuitry configured to: communicate, to a welding device, an enable signal indicating whether to enable or disable a welding process based on whether a combination of the first response and the second response satisfies a third threshold; and communicate, to the welding device, a control signal to control the welding process based in part on the combination if the combination satisfies the third threshold.

Some disclosed welding control devices include a mechanical travel device configured to actuate the conductive target.

Welding-type power supply, welding-type power source, and welding-type system, as used herein, refers to any device capable of, when power is applied thereto, supplying welding, cladding, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

As used herein, the term "welding-type power" refers to power suitable for welding, plasma cutting, induction heating, CAC-A and/or hot wire welding/preheating (including laser welding and laser cladding).

As used herein, the term "torch" or "welding-type tool" can include a hand-held or robotic welding torch, gun, or other device used to create the welding arc.

As used herein, the term "welding mode" is the type of process or output used, such as CC, CV, pulse, MIG, TIG, spray, short circuit, etc.

Welding operation, as used herein, includes both actual welds (e.g., resulting in joining, such as welding or brazing) of two or more physical objects, an overlaying, texturing, and/or heat-treating of a physical object, and/or a cut of a physical object) and simulated or virtual welds (e.g., a visualization of a weld without a physical weld occurring).

The term "power" is used throughout this specification for convenience, but also includes related measures such as energy, current, voltage, and enthalpy. For example, controlling "power" may involve controlling voltage, current, energy, and/or enthalpy, and/or controlling based on "power" may involve controlling based on voltage, current, energy, and/or enthalpy. Electric power of the kind measured in watts as the product of voltage and current (e.g., V*I power) is referred to herein as "wattage."

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

The terms "control circuit" and "control circuitry," as used herein, may include digital and/or analog circuitry, discrete and/or integrated circuitry, microprocessors, digital signal processors (DSPs), and/or other logic circuitry, and/or associated software, hardware, and/or firmware. Control circuits may include memory and a processor to execute instructions stored in memory. Control circuits or control circuitry may be located on one or more circuit boards, that form part or all of a controller, and are used to control a welding process, a device such as a power source or wire feeder, motion, automation, monitoring, air filtration, displays, and/or any other type of welding-related system.

As used, herein, the term "memory" and/or "memory device" means computer hardware or circuitry to store information for use by a processor and/or other digital device. The memory and/or memory device can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), flash memory, solid state storage, a computer-readable medium, or the like.

The present methods and/or systems may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

FIG. 1 is a diagram of an example gas tungsten arc welding ("GTAW") system 100. In GTAW systems such as the system 100, a metal electrode 104, typically made of tungsten, is provided in a welding torch 102, and is generally not consumed (i.e., added to the base metal) during welding. Electric current is channeled through the electrode 104 from a welding type power source 106, and a flow of an inert shielding gas surrounds the electrode 104 during the welding operation, generally provided by fluid conduits leading to the welding torch 102. An arc is struck between the electrode 104 and the workpiece 108 to melt the workpiece 108 and filler metal 110. Shielding gas prevents oxidation and other contamination of the electrode and/or the weld.

The power source 106 includes power conversion circuitry 112 configured to condition input power 114 (e.g., from the AC power grid, an engine/generator set, a combination thereof, or other alternative sources) to welding-type power. The power source 106 provides welding-type current to the torch 102 via the power delivery cable 116. The power delivery cable 116 may be included within a conduit which includes a shielding gas hose which delivers shielding gas to the torch 102. In some examples, a data cable may also be included in bundle of cables which includes the shielding gas hose and the power delivery cable 116 to enable data transfer between the torch 102 and the power source 106. In some examples, communication is enabled between the torch 102 and the power source 106 via the power delivery cable 116. For example, data (e.g., voltage measurement data at the torch 102) may be transmitted to the power source 106 via the power delivery cable 116. A ground cable 118 connects the workpiece 108 to the power source 106 to complete the weld circuit between the power source 106, the torch 102, and the workpiece 108.

Control circuitry 120 of the power source 106 controls the power output by the power conversion circuitry 112 (e.g., the voltage output, current output, pulse length, pulse shape). The power source 106 also includes a user interface 122 at which an operator may view and adjust power source 106 settings. For example, an operator may set one or more settings (e.g., welding mode, voltage output, current output, pulse length, pulse shape) via the user interface 122. In some examples, the user interface 122 is a touchscreen display. In some examples, the user interface 122 includes a display 124 and one or more physical inputs 126, such as buttons or knobs. An operator may adjust one or more settings of the power source 106 by adjusting the inputs 126. The control circuitry 120 receives and processes inputs from the user interface 122 and controls the power conversion circuitry 112 according to the received inputs.

During a typical TIG welding operation, an operator may hold the torch 102 in one hand and a filler metal rod 110 in the other hand. The operator uses a physical control device 130 (e.g., a sensor) to control the output of welding-type power from the power source 106 to the torch 102 during the welding operation. In some examples, the physical control device 130 is a foot pedal, which allows the operator to actuate the physical control device 130 (foot pedal) and thereby control the output of the power source 106 while holding the torch 102 in one hand and the filler metal rod 110 in the other hand. In some examples, the physical control device 130 may be a handheld controller. In some examples, the physical control device 130 may be included on the torch 102. For example, the physical control device 130 may be a trigger or a slidable control on the torch 102.

The physical control device 130 includes an actuator 132 which can be manipulated by an operator. If the physical control device 130 is a foot pedal, for example, the actuator 132 is the top panel of the foot pedal which moves in a first direction (generally towards the ground or floor) when an operator applies pressure to the pedal and moves in the opposite direction (generally away from the ground or floor) when the operator releases pressure. Actuation of the actuator 132 causes movement of a conductive target 134. In some examples, the conductive target 134 may be an aluminum target. In some examples, the conductive target 134 may be a copper target. In some examples, the conductive target 134 may be a conductive target on a flexible printed circuit board 135 which is physically moved by the actuator 132. The physical control device 130 includes two inductive coils, Coil A 136 and Coil B 138. In some examples, Coil A 136 and Coil B 138 are printed onto a rigid printed circuit board 137. In some examples, the flexible printed circuit board 135 is biased to maintain a consistent distance between the rigid printed circuit board 137 and the flexible printed circuit board 135. In some examples, each of Coil A 136 and Coil B 138 is printed on its own rigid printed circuit board, and the flexible printed circuit board 135 is biased to maintain contact with at least one of the two rigid printed circuit boards.

The physical control device 130 includes control circuitry 140 which includes an inductance-to-digital converter 142 (e.g., measurement circuitry) and sensor circuitry A 144 and sensor circuitry B 146. Coil A 136, along with sensor circuitry A 144, forms a first resonator LC circuit (circuit A). Coil B 138, along with sensor circuitry B 146, forms a second resonator LC circuit (circuit B). The control circuitry 140 also includes communications circuitry 148 configured to communicate with the control circuitry 120 of the power source 106. In some examples, the communications circuitry 148 is a wireless interface configured to communicate with the control circuitry 120 of the power source 106 wirelessly. In some examples, the communications circuitry 148 communicates with the control circuitry 120 of the power source 106 via a wired connection.

As will be described in more detail below, the coils 136 and 138 have non-uniform coil spacing (e.g., each coil has at least one dense region and at least one region where the spacing is greater than the spacing in the dense region, which is a sparse region). As the actuator 132 is moved, the target 134 moves along the lengths of the coils 136 and 138, which causes the resonant frequencies of the first resonator LC circuit (which includes Coil A 136 and sensor circuitry A 144) and the second LC resonator circuit (which includes Coil B 138 and sensor circuitry 146) to change. The LDC 142 detects the change in resonant frequency and provides digital outputs proportional (e.g., directly or inversely proportional) to the resonant frequencies of the LC resonator circuits. Example LDC circuits include the Texas Instruments LDC1612 2-Channel 28-bit inductance to digital converter and the Texas Instruments LDC1614 4-channel Channel 28-bit inductance to digital converter. The Texas Instruments LDC1612 and LDX1614 are described in "LDC1612, LDC1614 Multi-Channel 28-Bit Inductance to Digital Converter (LDC) for Inductive Sensing," Texas Instruments, (LDC1612, LDC1614: SNOSCY9A—December 2014—Revised March 2018), which is hereby incorporated by reference in its entirety. In some other examples, the LDC 142 may provide an output that is proportional (e.g., directly or inversely proportional) to the inductance of the Coil A 136 and the Coil B 138. Information about LDC circuits may be found "LDC Sensor Design" by Chris Oberhauser, Texas Instruments (Application Report SNOA930A—March 2015—Revised April 2018). The entirety of "LDC Sensor Design" by Chris Oberhouser is hereby incorporated by reference. LDC circuits are also described in "LDC1612/LDC1614 Linear Position Sensing" by Ben Kasemsadeh, Texas Instruments, (Application Report: SNOA931—April 2015). The entirety of "LDC1612/LDC1614 Linear Position Sensing" by Ben Kasemsadeh is hereby incorporated by reference. Additional information about LDC circuits may be found in "LDC Target Design" by Chris Oberhauser, Texas Instruments, (Application Report: SNOA957A—September 2016—Revised May 2017). The entirety of "LDC Target Design" by Chris Oberhauser is hereby incorporated by reference.

In the system 100, Coil A 136 and Coil B 138 are positioned adjacent each other and in opposing orientations. Coil A 136 is positioned such that at the resting position of the target 134 (e.g., the position of the target 134 when no physical force is applied), the target 134 is just past the transition point and within the sparse region of Coil A 136. At the fully actuated position of the target 134 (e.g., the farthest the target 134 can be physically actuated), the target 134 is still within the sparse region of Coil A 136. Coil B 138 is positioned such that at the resting position of the target 134, the target 134 is within the sparse region of Coil B 138. At the fully actuated position of the target 134, the target 134 is still within the sparse region of Coil B 138 and has not passed the transition point. Accordingly, as the target 134 moves from the resting position to the fully actuated position, the output of the LDC 142 for Coil A 136 decreases monotonically while the output of the LDC 142 for Coil B 138 will increases monotonically.

The combined output of the LDC 142 for Coil A 136 and Coil B 138 can be used similarly to the functions of a switch and a potentiometer in a conventional sensor. When the combined output passes a threshold, the control circuitry 140 sends an "on" signal to the control circuitry 120 of the power source 106 via the communications circuitry 148 to begin outputting welding-type power. Similarly, when the target 134 passes back across that threshold point, the output of the LDC 142 falls below the threshold. The communications circuitry 148 then communicates an "off" signal to the control circuitry 120. Past the threshold (e.g., after the communications circuitry 148 sends an "on" command), the control circuitry 140 sends a signal to the control circuitry 120 of the power source 106 via the communications circuitry 148 to control the level of power (e.g., voltage or current magnitude) output by the power source 106 based on the position of the target as determined by the combined output of the LDC 142 for Coil A 136 and Coil B 138.

In some examples, Coil A 136 and Coil B 138 may be arranged in the same instead of in opposing orientations. In such examples, the target 134 may be configured to travel within the sparse regions of both Coil A 136 and Coil B 138. In examples where the coils (136 and 138) are arranged in the same orientation, as the target 134 is moved from the resting position to the fully actuated position, the output of the coils (136 and 138) both increase or both decrease, depending on the orientation of the coils (136 and 138). In some examples, the target 134 may be configured to travel only within one or both of the dense regions of Coil A 136 and/or Coil B 138 instead of the sparse region of Coil A 136 and/or Coil B 138. For each coil (Coil A 136 and Coil B 138), the target 134 is physically limited to travelling only within either the sparse region or the dense region and not both, such that the output of the LDC 142 for each coil is monotonic.

The physical control device 130 may function similarly to a switch and a potentiometer in a conventional sensor to both initiate and terminate welding-type power supplied by the power source 106 to the torch 102, and control the level or magnitude of power supplied by the power source 106 to the torch 102.

Although illustrated as a GTAW welding system, the physical control device 130 could be used in any welding-type application which utilizes a switch to turn on and off any type of output and a potentiometer to control the level of that output. For example, the physical control device 130 could be used in a knob of one of the inputs 126 of the power source 106. In such examples, the knob would act as the actuator 132 and move a conductive target 134 along the length of the coils 136 and 138 as the knob is manipulated. The coils 136 and 138 are configured with a geometry to correspond to the movement of the conductive target 134, which may be different for different types of input devices (e.g., foot pedals vs. rotating knobs). The output of the LDC 142 would correspond to the position of the knob and could be used to control whichever function that the knob controls.

To prevent error caused by movement in the z-axis, in some examples, the target 134 and the coils Coil A 136 and Coil B 138 are biased to maintain a consistence distance relative to each other in the z-axis. In some examples, the target 134 is printed onto a flexible printed circuit board 135, and the coils (136 and 138) are printed onto a rigid printed circuit board 137. In some examples, the flexible printed circuit board 135 is biased such that the flexible printed circuit board maintains 135 a consistent distance with the rigid printed circuit board 137.

Figure 2:
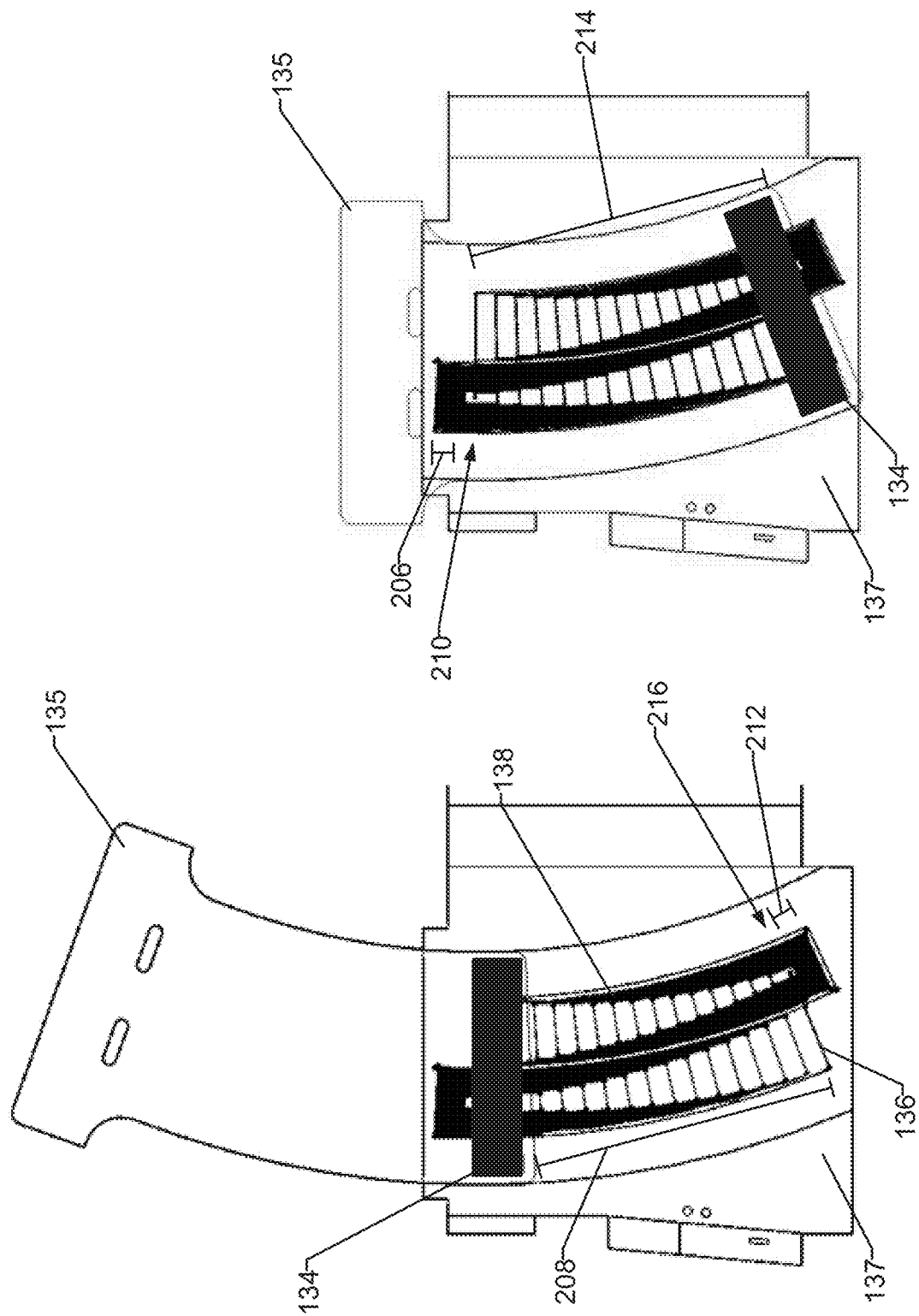
FIG. 2a illustrates an example implementation of the sensor of FIG. 1, including two inductive coils and a conductive target, in which the conductive target is positioned at a first position.
FIG. 2b illustrates the example sensor of FIG. 2a, in which the conductive target is at a second position.

FIGS. 2a and 2b illustrate an example target 134 sweeping across example coils (Coil A 136 and Coil B 138) as the target 134 is actuated in a physical control device 130. In the example illustrated in FIGS. 2a, 2b the physical control device 130 is a foot pedal, and the coils 136 and 138 are slightly arced because the physical path that the target 134 travels as the target 134 is actuated by the foot pedal is arc-shaped. As shown in FIGS. 2a and 2b, the target 134 is on (e.g., printed onto or attached to) a flexible board 135, and the coils (136 and 138) are printed onto a rigid circuit board 137. In some examples, the flexible board 135 is biased such that the flexible board 135 maintains a consistent distance in the z-axis with the rigid printed circuit board 137.

Coil A 136 has a dense region 206, a sparse region 208, and a transition point 210.

Coil B 138 has a dense region 212, a sparse region 214, and a transition point 216. In FIG. 2a, the physical control device 130 is at a resting position (e.g., the position at rest). At the resting position (FIG. 2a), the target 134 is located within the sparse region 208 of Coil A 136 just past the transition point 210. At the resting position (FIG. 2a), the target 134 is within the sparse region 214 of Coil B 138. In FIG. 2b, the physical control device 130 is at a fully actuated position (e.g., the farthest position the target 134 can be physically actuated with respect to the resting position). At the fully actuated position (FIG. 2b), the target 134 is located within the sparse region 208 of Coil A 136 and the sparse region 214 of Coil B 138 just before the transition point 216 of Coil B 138.

Accordingly, the target 134 is configured to travel within the sparse regions 208 and 214 of Coil A 136 and Coil B 138, respectively. As the target 134 moves from the resting position (shown in FIG. 2a) to the fully actuated position (shown in FIG. 2b), the output of the LDC 142 for Coil A 136 decreases, and the output of the LDC 142 for Coil B 138 increases.

The sparse region (e.g., region 208 of Coil A 136 and region 214 of Coil B 138) refers to the region where the distance between corresponding portions of successive turns of the coil is greater than a threshold distance. The dense region (e.g., region 206 of Coil A 136 and region 212 of Coil B 138) refers to the region where the distance between corresponding portions of successive turns of the coil is less than a threshold distance.

Figure 3:
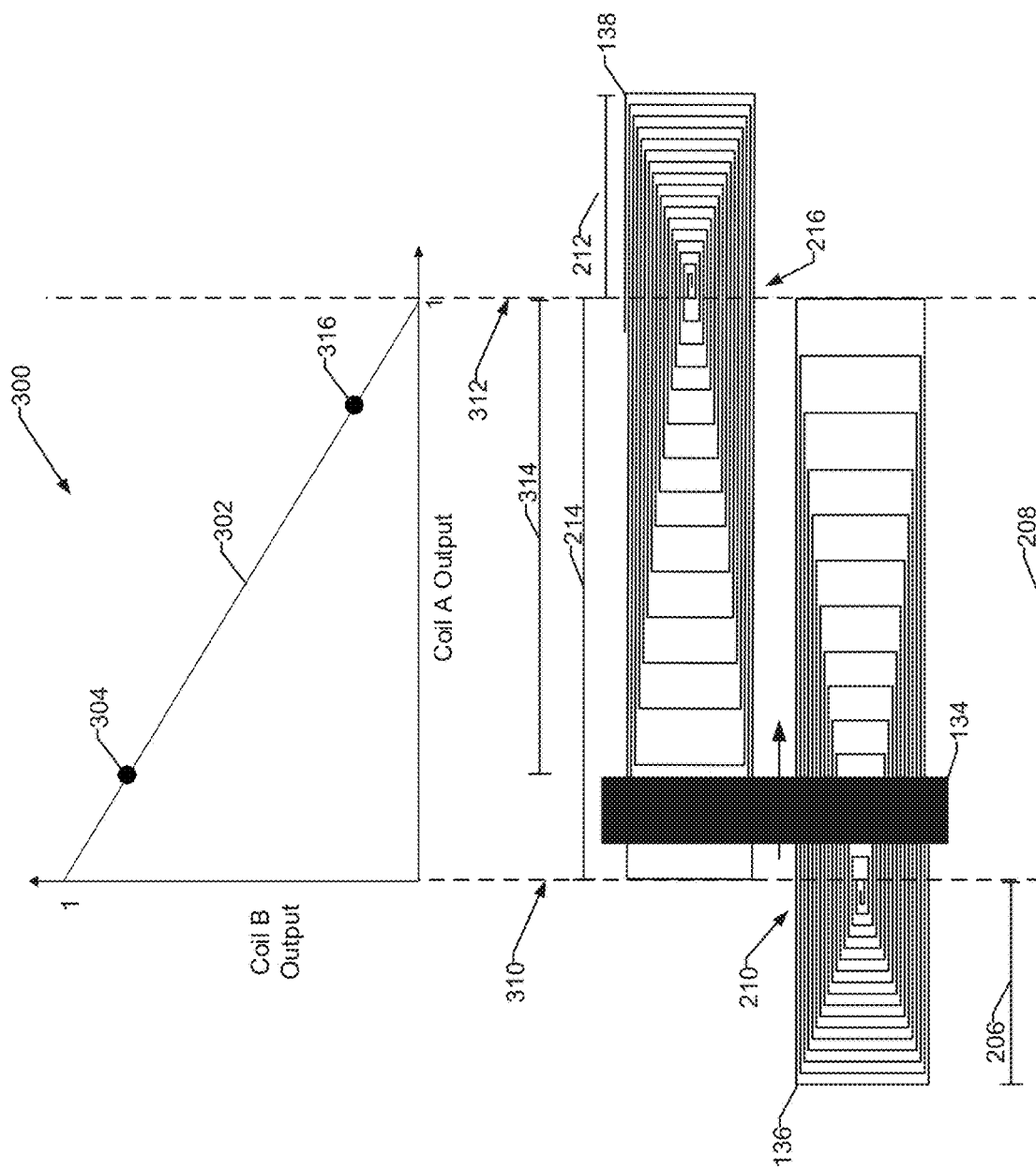
FIG. 3 is a graph illustrating a relationship between an example response of an example sensor including two inductive coils to a position of a conductive target relative to first and second inductive coils of the sensor, in accordance with aspects of this disclosure.

FIG. 3 is a graph illustrating a relationship between an example response of the physical control device 130 to a position of the conductive target 134 relative to first and second inductive coils (Coil A 136 and Coil B 138). Plot 300 demonstrates an example output of the LDC 142 for Coil A 136 and Coil B 138 with respect to positions of the target 134 between a resting position 310 and a fully actuated position 312. The output of the LDC 142 for Coil A 136 is indicated on the x-axis of plot 300, and the output of the LDC 142 for Coil B 138 is indicated on the y-axis of plot 300. At the resting position 310, the target 134 is just beyond the transition point 210 of Coil A 136 and is within the sparse region 208 of Coil A 136. At the fully actuated position 312, the target 134 is just before the transition point 216 of Coil B 138 and is within the sparse region 214 of Coil B 138. The target 134 is configured to travel within the sparse regions 208 and 214 of Coil A 136 and Coil B 138, respectively. Line 302 of the plot 300 demonstrates an ideal scaled output of the LDC 142 for Coil A 136 and Coil B 138. As demonstrated by line 302 of the plot 300, as the target 134 travels from the resting position 310 to the fully actuated position 312, the output of the LDC 142 for Coil A 136 decreases, and the output of the LDC 142 for Coil B 138 increases. The combination of the output of the LDC 142 for Coil A 136 and Coil B 138 (plotted as line 302) is a function of the position of the target 134.

The control circuitry 140 can use a threshold point 304 as a switch point. For example, when the target 134 is at a position such that the output of the LDC 142 is at a point on the line 302 having an x-coordinate value greater than the x-coordinate value of the threshold point 304, the control circuitry 140 outputs an "on" signal (e.g., via communications circuitry 148). When the target 134 is at a position such that the output of the LDC 142 is at a point on the line 302 having an x-coordinate value less than the x-coordinate value of the threshold point 304, the control circuitry 140 outputs an "off" signal (e.g., via communications circuitry 148). Points on the line 302 having an x-coordinate value greater than the x-coordinate value of the threshold point 304 are referred to as a magnitude control region 314. When the output of the LDC is in the magnitude control region 314, the control circuitry 140 also outputs a magnitude signal (e.g., via communications circuitry 148). Thus the physical control device 130 can be used as an on/off switch for the output of a device (e.g., a power supply) and to control the output level of the device.

In some examples, the control circuitry 140 may recognize when a second threshold point 316 is reached. For example, the output of the LDC 142 may occur at point 316 when the pedal is pressed close to the fully actuated point 312 (or in some examples the second point 316 may be the fully actuated point 312). The control circuitry 140 may recognize that the pedal has been pressed to the second threshold point because the output of the LDC 142 is at point 316. In some examples, if the control circuitry 140 recognizes that the LDC 142 output has reached point 316, then the control circuitry 140 will communicate to the control circuitry 120 of the power source 106 to supply output power at a stable level (which may be for example the maximum set output power) until the control circuitry 140 determines that the pedal has been pressed to the second threshold point 316 again by determining for a second time that the LDC 142 output is at point 316. Accordingly, the control circuitry 140 may recognize a point on the LDC 142 output plot as a second switch in addition to the first switch at point 304. This second switch may be used for purposes such as triggering the control circuitry 140 to control the welding-type power source 106 to control the output power according to a predetermined set of parameters. For example, the second switch, when triggered, may cause the control circuitry 140 to signal to the control circuitry 120 to control the power conversion circuitry 112 to output a full power level configured via the user interface, to switch on an arc stabilizing circuit, and/or any other parameter and/or process configuration.

Figure 4:
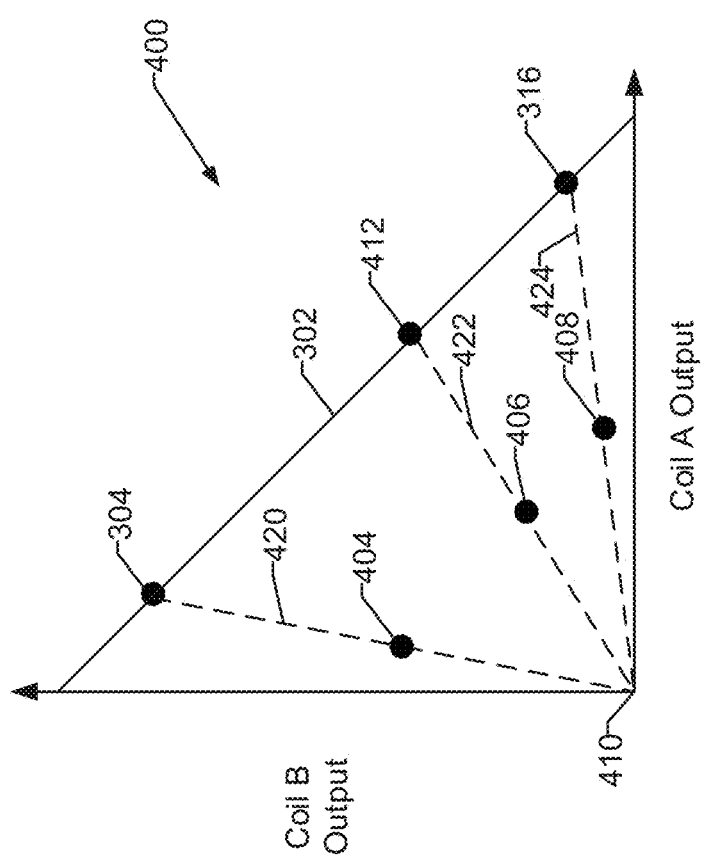
FIG. 4 is a plot of example outputs of an inductance-to-digital converter, which has as inputs the frequencies of the circuits including the inductive coils of FIGS. 2a-2b, and which shows an effect on the inductance-to-digital converter output when the conductive target moves away from the plane which includes the coils.

FIG. 4 is a plot 400 demonstrating the response to movement of the target 134 away from the plane of the coils (e.g., in the z-axis when the plane of the coils is the x-y plane). As with plot 300 of FIG. 3, the x-axis of plot 400 shows the output of the LDC 142 for the circuit including Coil A 136, and the y-axis of plot 400 shows the output of the LDC 142 for the circuit including Coil B 138.

As explained above, Coil A 136 and Coil B 138 are positioned in the same physical plane (e.g., an x-y plane). The z-axis is perpendicular to the x-y plane. Under normal circumstances, the target 134 is a given distance in the z-axis from the x-y plane (e.g., the target 134 is configured to travel in a plane parallel to the plane containing the coils). In some examples, the target 134 is printed onto a flexible printed circuit board 135, and Coil A 136 and Coil B 138 are printed onto a rigid printed circuit board 137. In some examples, the flexible printed circuit board 135 is biased such that the flexible printed circuit board 135 maintains a consistent distance with the rigid printed circuit board 137. In such situations, the target 134 maintains the same distance from the x-y plane in the z-axis. In some examples, the coils (136 and 138) may be printed onto a flexible board biased to maintain a consistent distance from the target 134 in the z-axis while the target is fixed in the x-y plane.

In real-world applications, the target 134 may move away from or closer to the x-y plane that includes Coil A 136 and Coil B 138. When the target 134 moves away from the coils in the z-axis, the output of the LDC 142 for the circuits including the coils decreases. If only one coil, (e.g., Coil A 136) is used, then if the target 134 moves away from the x-y plane in the z-axis, the output of the LDC 142 would decrease and the control circuitry 140 would determine that the output from the power source 106 should be decreased. In other words, movement of the target 134 away from the x-y plane in the z-axis appears to the LDC 142 like movement from the dense region to the sparse region of the coil. Thus, movement of the target 134 in the z-axis constitutes error. Disclosed examples using two coils mitigates the potential for error resulting from movement of the target 134 toward and/or away from the plane of the coils 136, 138.

Line 302 represents an ideal example plot in which the target 134 does not move in the z-axis. Line 302 may be stored in memory of the control circuitry 140 as a reference line. The control circuitry 140 may use reference line 302 to control the output of a device (e.g., the power supply 106). Points 404, 406, and 408 are points that are not located on the reference line 302, indicating that the target 134 has moved away from the x-y plane in the z-axis. Since both coils 136 and 138 are affected by the same error (the movement away from the x-y axis), the control circuitry 140 recognizes the error by determining that the output from the LDC 142 is smaller than expected (e.g., that the actual output point (404, 406, 408) is not on the ideal line 302). The control circuitry 140 then compares an actual output point (e.g., the points 404, 406, 408) to the reference line 302 to correct for the error. The control circuitry 140 may determine which point on the reference line 302 corresponds to the actual output point (e.g., 404, 406, 408) by determining the intersection point of the reference line 302 with a line (e.g., line 420, 422, 424) that passes through the actual point (e.g., 404, 406, 408) and the origin 410. For example, the control circuitry 140 determines that actual point 404 corresponds to point 304 on the reference line 302 (e.g., the first threshold point of FIG. 3). The control circuitry 140 determines that actual point 406 corresponds to point 412 on the reference line 302, and that actual point 408 corresponds to point 316 on the reference line 302 (e.g., the second threshold point).

The point on the reference line 302 (e.g., point 304, 412, or 316) that corresponds to an actual measured point (e.g., point 404, 406, or 408) can be determined via the equations:

$$x = \frac{1}{B+1}$$

and y=x+1, where B is the slope of the line (e.g., line 420, 422, or 424) that passes through the actual measured point (e.g., point 404, 406, or 408) and the origin 410.

Figure 5A:
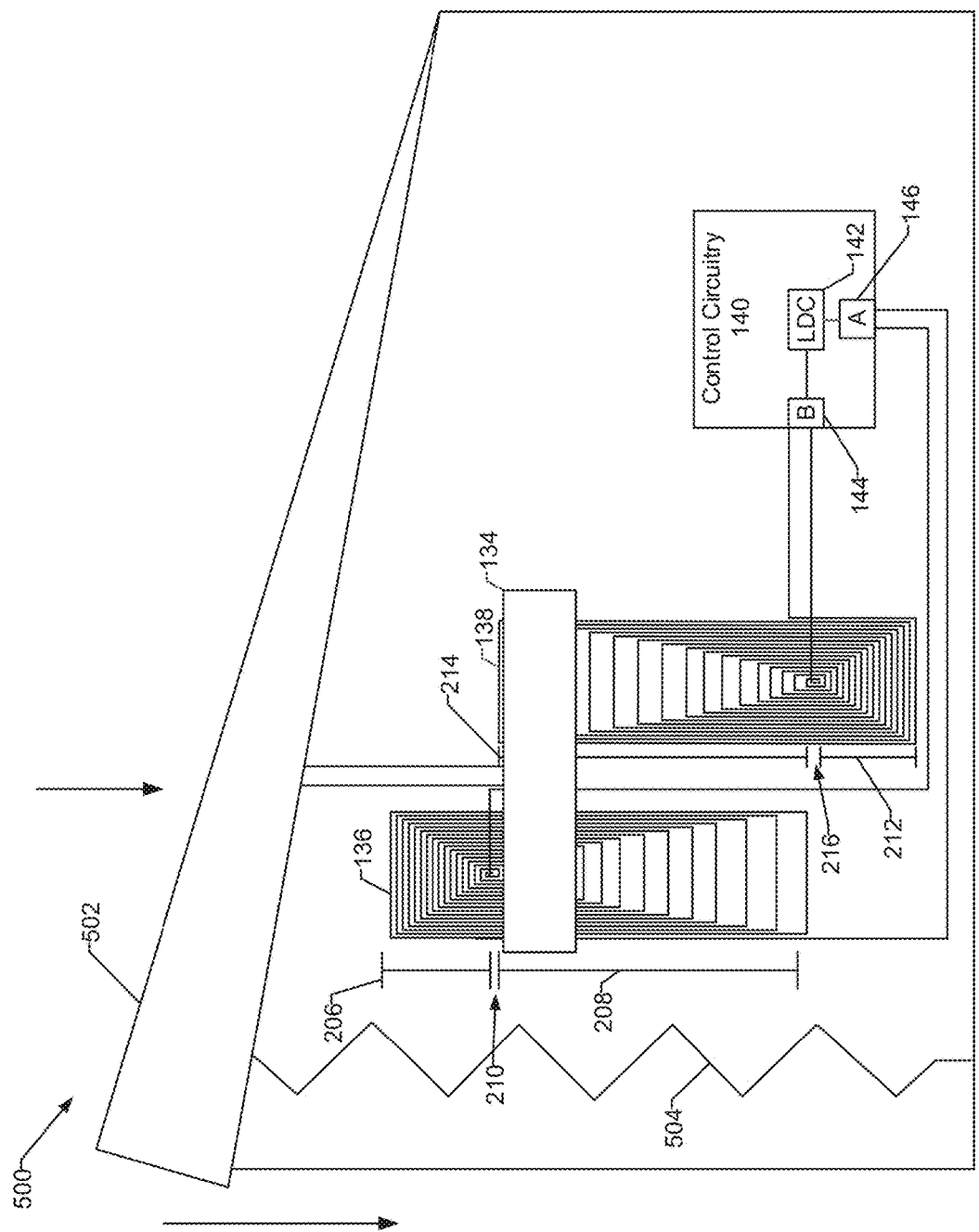
FIG. 5a is a diagram of a foot pedal which includes an inductive sensor including two inductive coils which may be used to control welding-type output from a welding-type power source.
Figure 5B:
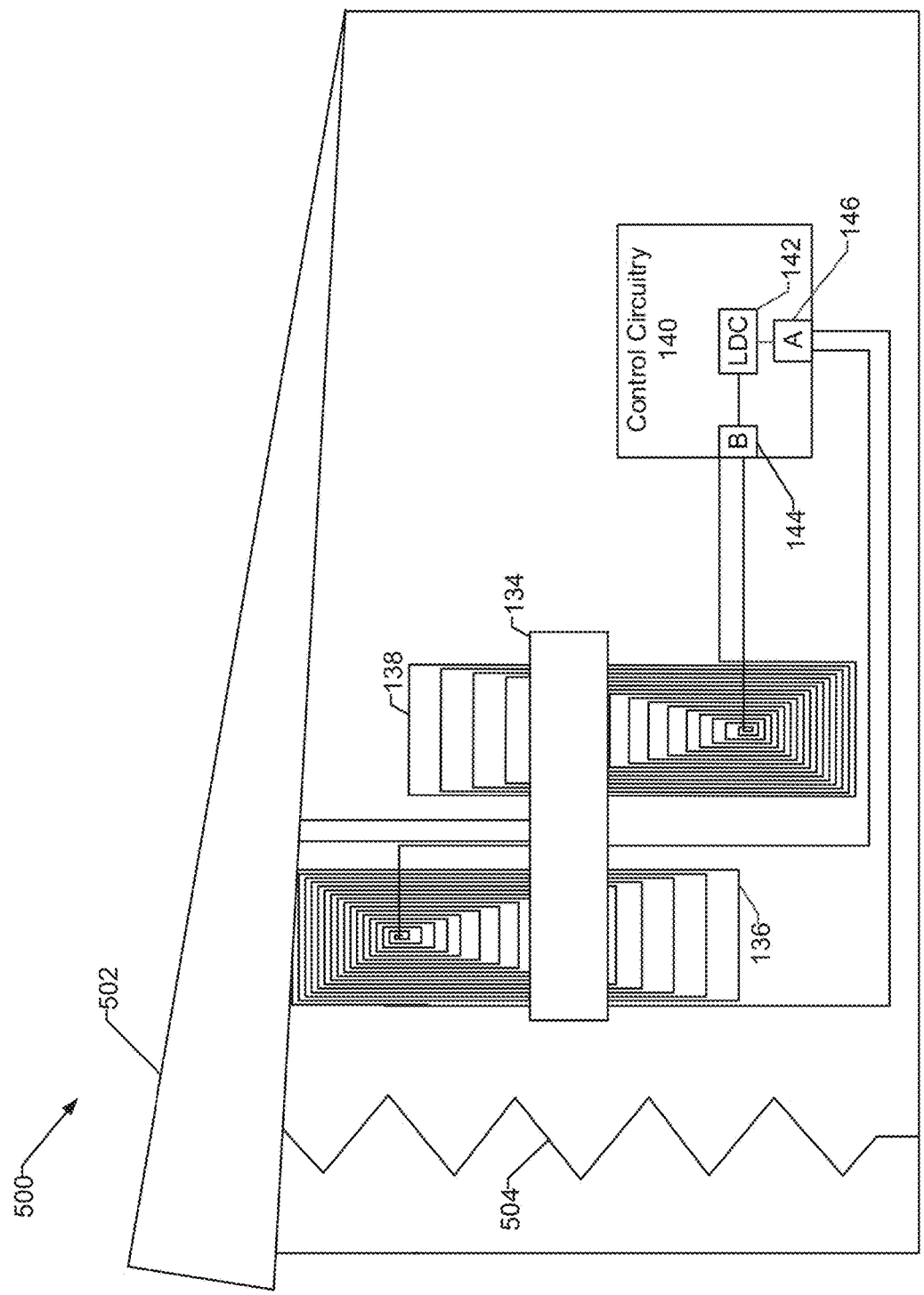
FIG. 5b is a diagram of the foot pedal of FIG. 5a in which the foot pedal has been actuated.

FIGS. 5a and 5b illustrate an example foot pedal 500 which may be used to control the output of a welding power source, for example the power source 106 of FIG. 1. The foot pedal 500 includes a Coil A 136 and a Coil B 138 as well as control circuitry 140. The control circuitry 140 includes sensor circuitry A 144 and sensor circuitry B 146 as well as an LDC 142 to convert the response of the inductive circuits including the coils (Coil A 136 and sensor circuitry A 144 constitute inductive circuit A and Coil B 138 and sensor circuitry B 146 constitute inductive circuit B).

When an operator presses down on the panel 502 of the foot pedal 500, the conductive target 134 moves downwards from the resting position along the lengths of the sparse regions 208 and 214 of Coil A 136 and Coil B 138. A spring 504 is biased to push upwards against the panel 502 so that the panel 502 returns to its original position when the operator is not pressing down on the panel 502. In the resting position (shown in FIG. 5a), the target 134 is within the sparse regions 208 and 214 of both coils (136 and 138), and is adjacent the transition point 210 of Coil A 136. As the panel 502 is actuated, the target 134 moves downwards along sparse regions 208 and 214 of the coils (Coil A 136 and Coil B 138). The output of the LDC 142 for Coil A 136 decreases as the target 134 moves downward, and the output of the LDC 142 for Coil B 138 increases as the target 134 moves downward.

The control circuitry 140 processes the outputs of the LDC 142 to determine when the combined output of the LDC 142 exceeds a threshold. Whether the output for circuit A exceeds a threshold functions as a switch. The outputs of the LDC 142 for circuit A and circuit B are approximately linear, and thus can be used similarly to a potentiometer. Accordingly, the control circuitry 140 processes the output of the LDC 142 and sends signals to control circuitry 120 of the power source 106 based on the processed output of the LDC 142. The output of the LDC 142 is based on the position of the target 142, which is based on the position of the panel 502 of the foot pedal 500. Accordingly, an operator may control the output of the power source 106 by controlling the position of the foot pedal 500.

Although generally described as controlling output power in TIG welding applications, the inductive sensors described may be used in any welding type application to control any welding parameter or used for the synergistic control of multiple parameters.

While the present method and/or system has been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A sensor, comprising:
a first coil having a first region and a second region, the first region having a spacing between successive corresponding portions of turns of the first coil less than a first threshold distance, and the second region having a spacing between successive corresponding portions of turns of the first coil greater than the first threshold;
a second coil having a third region and a fourth region, the third region having a spacing between successive corresponding portions of turns of the second coil less than a second threshold distance, and the fourth region having a spacing between successive corresponding portions of turns of the second coil greater than the second threshold;
a conductive target configured to travel within a travel zone extending from a first location to a second location, wherein both the first location and the second location are adjacent to both the second region and the fourth region; and
measurement circuitry configured to:
measure a first response of the first coil and a second response of the second coil to detect when a combination of the first response and the second response satisfies a threshold value;
while the conductive target is within the travel zone, determine a position of the conductive target within the travel zone;
output a first signal indicating whether the combination satisfies the threshold value; and
output a second signal based on the magnitude of the combination if the combination satisfies the threshold value.

2. The sensor of claim 1, wherein the combination is a function of the first response and the second response.

3. The sensor of claim 1, wherein the measurement circuitry is configured to determine the position of the conductive target relative to the first coil and the second coil based on the combination of the first response and the second response after determining that the combination satisfied the third threshold.

4. The sensor of claim 1, wherein the first response corresponds to a first inductance and the second response corresponds to a second inductance.

5. The sensor of claim 1, wherein the first coil is connected to a first resonant circuit and the second coil is connected to a second resonant circuit, and wherein the first response comprises a first resonant frequency of the first resonant circuit and the second response comprises a second resonant frequency of the second resonant circuit.

6. The sensor of claim 1, wherein the first coil and the second coil are formed on a first circuit board, and wherein the conductive target comprises a conductive strip or a second circuit board.

7. The sensor of claim 6, wherein the first circuit board is a rigid printed circuit board and the second circuit board is a flexible circuit board.

8. The sensor of claim 7, wherein the second circuit board is biased to reduce a variation in distance between the first circuit board and the second circuit board as the target travels within the travel zone.

9. The sensor of claim 1, wherein the first coil and the second coil are located in a first plane, wherein the conductive target is configured to travel in a second plane, and wherein the second plane is parallel to the first plane.

10. The sensor of claim 1, wherein the first coil and the second coil are arranged such that the first response increases in magnitude and the second response decreases in magnitude as the target moves from the first location to the second location.

11. The sensor of claim 1, wherein the first coil and the second coil are arranged such that the first response decreases in magnitude and the second response decreases in magnitude as the target moves from the first location to the second location.

12. The sensor of claim 1, wherein the first coil and the second coil are arranged such that the first response increases in magnitude and the second response increases in magnitude as the target moves from the first location to the second location.

13. A mechanically actuated controller comprising:
a first coil having a first region and a second region, the first region having a spacing between successive corresponding portions of turns of the first coil less than a first threshold distance, and the second region having a spacing between successive corresponding portions of turns of the first coil greater than the first threshold;
a second coil having a third region and a fourth region, the third region having a spacing between successive corresponding portions of turns of the second coil less than a second threshold distance, and the fourth region having a spacing between successive corresponding portions of turns of the second coil greater than the second threshold;
a mechanical travel device configured to actuate a conductive target, wherein the conductive target is configured to travel within a travel zone extending from a first location to a second location, wherein both the first location and the second location are adjacent to both the second region and the fourth region; and
measurement circuitry configured to:
measure a first response of the first coil and a second response of the second coil to detect when a combination of the first response and the second response satisfies a threshold value;
while the conductive target is within the travel zone, determine a position of the conductive target within the travel zone;
output a first signal indicating whether the combination satisfies the threshold value; and
output a second signal based on the magnitude of the combination if the combination satisfies the threshold value.

14. The controller of claim 13, wherein the mechanical travel device is a foot pedal.

15. A welding control device comprising:
a first coil having a first region and a second region, the first region having a spacing between successive corresponding portions of turns of the first coil less than a first threshold distance, and the second region having a spacing between successive corresponding portions of turns of the first coil greater than the first threshold;

a second coil having a third region and a fourth region, the third region having a spacing between successive corresponding portions of turns of the second coil less than a second threshold distance, and the fourth region having a spacing between successive corresponding portions of turns of the second coil greater than the second threshold;

a conductive target configured to travel within a travel zone extending from a first location to a second location, wherein both the first location and the second location are adjacent to both the second region and the fourth region;

measurement circuitry configured to measure a first response of the first coil and a second response of the second coil to a position of the conductive target within the travel zone; and communications circuitry configured to:
  communicate, to a welding device, an enable signal indicating whether to enable or disable a welding process based on whether a combination of the first response and the second response satisfies a third threshold; and
  communicate, to the welding device, a control signal to control the welding process based in part on the combination if the combination satisfies the third threshold.

16. The welding control device of claim 15, comprising a mechanical travel device configured to actuate the conductive target.

* * * * *